US006451702B1

(12) United States Patent
Yang et al.

(10) Patent No.: US 6,451,702 B1
(45) Date of Patent: Sep. 17, 2002

(54) METHODS FOR FORMING LATERAL TRENCH OPTICAL DETECTORS

(75) Inventors: Min Yang, Kingston, NY (US); Kern Rim, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/784,963

(22) Filed: Feb. 16, 2001

(51) Int. Cl.$^7$ ............................................. H01L 21/302
(52) U.S. Cl. ....................... 438/706; 438/710; 438/712; 438/720
(58) Field of Search ................................. 438/706, 710, 438/712, 720, 16, 245, 246, 248, 249; 257/432, 436

(56) References Cited

U.S. PATENT DOCUMENTS

| | | | | |
|---|---|---|---|---|
| 5,656,535 A | * | 8/1997 | Ho et al. ..................... | 438/386 |
| 5,994,751 A | * | 11/1999 | Oppermann ................ | 257/446 |
| 6,177,289 B1 | | 1/2001 | Crow et al. | |
| 6,228,750 B1 | * | 8/2001 | Shibib ......................... | 438/558 |

OTHER PUBLICATIONS

U.S. Patent Application Ser. No. 09/678,315, filed Oct. 3, 2000, for "Silicon–on–Insulator (SOI) Trench Photodiode and Method of Forming Same".

Rong–Heng Yuang et al., "Overall Performance Improvement in GaAs MSM Photodetectors by Using Recessed––Cathode Structures", IEEE Photonics Technology Letters, vol. 9, No. 2, Feb. 1997.

Jacob Y.L. Ho and K.S. Wong, "Bandwidth Enhancement in Silicon Metal–Semiconductor–Metal Photodetector by Trench Formation", IEEE Photonics Technology Letters, vol. 8, No. 8, Aug. 1996.

\* cited by examiner

Primary Examiner—Robert Kunemund
Assistant Examiner—Lan Vinh
(74) Attorney, Agent, or Firm—F. Chau & Associates, LLP (57) ABSTRACT

A method for forming an optical detector device on a semiconductor substrate. The method includes forming a first set and a second set of trenches in the substrate, wherein trenches of the first set are alternately disposed with respect to trenches of the second set, filling the trenches with a sacrificial material, and etching the sacrificial material from the first set of trenches. The method further includes filling the first set of trenches with a doped material of a first conductivity, etching the sacrificial material from a second set of trenches, filling the second set of trenches with a doped material of a second conductivity, forming a first junction layer by driving dopants from the doped material in each of the first set of trenches and forming a second junction layer by driving dopants from the doped material in each of the second set of trenches, and providing separate wiring connections to the first set of trenches and the second set of trenches. The first and second set of trenches are formed simultaneously.

21 Claims, 7 Drawing Sheets

METHODS FOR FORMING LATERAL TRENCH OPTICAL DETECTORS

BACKGROUND OF THE INVENTION

1. Field of the Invention

The present invention generally relates to optical detectors, and more particularly, to lateral trench optical detectors formed on a semiconductor opto-electronic integrated circuit.

2. Description of Prior Art

According to prior art methods of forming trench based optical detectors, in order to form the detector, trenches for different types of electrodes needed to be etched separately, increasing the number of steps in the fabrication process. Because these steps are among the more expensive steps in the fabrication of optical detectors, the production costs reflect the added expense.

Therefore, a need exists for a method of forming a lateral trench p-i-n photo-diodes (LTD) wherein the trenches are patterned and then etched for all electrode types simultaneously.

SUMMARY OF THE INVENTION

According to an embodiment of the present invention, a method is provided for forming an optical detector device on a semiconductor substrate. The method includes forming a first set and a second set of trenches in the substrate, wherein trenches of the first set are alternately disposed with respect to trenches of the second set, filling the trenches with a sacrificial material, and etching the sacrificial material from the first set of trenches. The method further includes filling the first set of trenches with a doped material of a first conductivity, etching the sacrificial material from a second set of trenches, filling the second set of trenches with a doped material of a second conductivity, forming a first junction layer by driving dopants from the doped material in each of the first set of trenches and forming a second junction layer by driving dopants from the doped material in each of the second set of trenches, and providing separate wiring connections to the first set of trenches and the second set of trenches. The first set and the second set of trenches in the substrate are formed simultaneously.

Etching the sacrificial material from the first set of trenches further comprises the steps of removing sacrificial material from a surface of the device, and masking the second set of trenches. Etching the sacrificial material from a second set of trenches includes exposing the sacrificial material of the second set of trenches to a surface of the device.

Providing separate wiring connections includes exposing the doped material filling the first set of trenches and the doped material filling the second set of trenches to a surface of the device, and providing each of the first set of trenches with a first set of contacts and the second set of trenches with a second set of contacts.

Forming the junction layers further comprises the steps of depositing a diffusion barrier layer over a surface of the device prior to forming the junction layers, and removing the diffusion barrier layer from a surface of the device after forming the junction layers.

Exposing the sacrificial material of the second set of trenches further includes the step of removing the doped material of the first conductivity from a region above the second set of trenches by mechanical polish. Exposing the sacrificial material of the second set of trenches includes patterning the doped material of the first conductivity, and etching the doped material of the first conductivity in a region above the second set of trenches.

The material of the first conductivity comprises n-type doped polysilicon and the material of the second conductivity comprises p-type doped polysilicon. Alternatively, the material of the first conductivity comprises p-type doped polysilicon and the material of the second conductivity comprises n-type doped polysilicon.

The substrate includes a semiconductor material, a $SiO_2$ layer deposited over the semiconductor material, and a SiN layer deposited over the a $SiO_2$ layer.

According to an embodiment of the present invention, a method is provided for forming an optical detector device on a semiconductor substrate. The method includes forming a first set and a second set of trenches in the substrate, wherein trenches of the first set are alternately disposed with respect to trenches of the second set, filling the trenches with a sacrificial material of a first conductivity, and etching the sacrificial material from the first set of trenches. The method further includes filling the first set of trenches with a doped material of a second conductivity, forming a first junction layer by driving dopants from the doped material in each of the first set of trenches and forming a second junction layer by driving dopants from the sacrificial material in each of the second set of trenches, etching the sacrificial material from the second set of trenches, filling the second set of trenches with an electrode material, and providing separate wiring connections to the first set of trenches and the second set of trenches.

Etching the sacrificial material from the first set of trenches further includes removing sacrificial material from a surface of the device, and masking the second set of trenches.

Prior to forming the junction layers, the doped material of the second conductivity is removed from a surface of the device. Forming junction layers further includes depositing a diffusion barrier layer over the surface of the device prior to forming the junction layers, and removing the diffusion barrier layer from a surface of the device after forming the junction layers.

Providing separate wiring connections further comprises the step of exposing the doped material filling the first set of trenches and the electrode material filling the second set of trenches to a surface of the device. The electrode material is one of doped material of the first conductivity and undoped material.

According to an embodiment of the present invention, a method is provided for forming an optical detector device on a semiconductor substrate. The method includes forming a first set and a second set of trenches in the substrate, wherein trenches of the first set are alternately disposed with respect to trenches of the second set, filling the trenches with a sacrificial material, and etching the sacrificial material from the first set of trenches. The method further includes forming a junction layer in the wall of each of the first set of trenches by gas phase doping, forming a second junction layer in the wall of each of the second set of trenches, wherein dopants are driven from the sacrificial material into the walls, filling the first set of trenches with a doped material of a first conductivity, etching the sacrificial material from the second set of trenches, filling the second set of trenches with a doped material of a second conductivity, and providing separate wiring connections to the first set of trenches and the second set of trenches.

Etching the sacrificial material from the first set of trenches includes removing the sacrificial material from a surface of the device, and masking the second set of trenches. Etching the sacrificial material from the second set of trenches further comprises the step of removing doped material of the first conductivity from a surface of the device.

Providing separate wiring connections includes exposing the doped material filling the first set of trenches and the doped material filling the second set of trenches to a surface of the device.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

An optical detector is formed on a semiconductor substrate by forming a plurality of substantially parallel trenches in the substrate to form a plurality of regions separated by alternating trench regions of n-type and p-type doped material. The n-type regions are connected together to form an n-contact. The p-type regions are connected together to form a p-type contact. The regions separating the trenches function as intrinsic semiconducting layer (i), thereby forming a plurality of parallel p-i-n photo-diodes. The basic principle behind this detector topology is to move free carriers in the absorption region of the detector in a direction perpendicular to the incident of light.

The present invention discloses a method of optical detector formation in which trenches for both n-type and p-type doped material are patterned and then etched at the same time to form the desired interdigitated photo-diode device. The desired structure can then be achieved by plugging a first set of trenches with a sacrificial layer, while filling a second set with an electrode material (e.g., polysilicon). Thus, the present invention proposes a method of forming a lateral trench optical detector wherein a first and a second set of trenches are patterned and then etched simultaneously. By reducing the number of lithographic patterning and deep trench etching steps in the photo-detector fabrication process, the present invention can reduce production costs.

Figure 1:
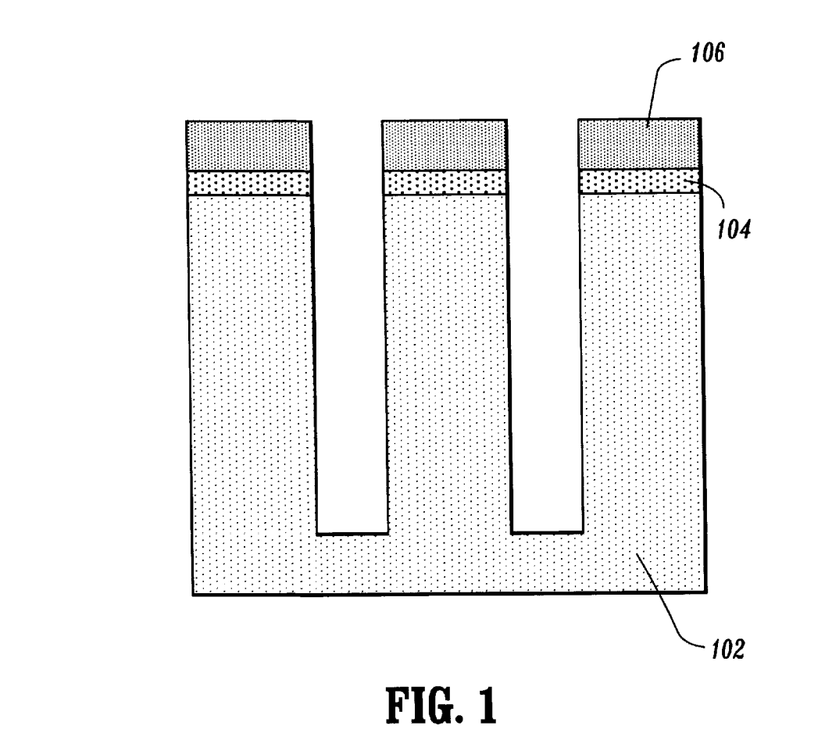
FIG. 1 is cross-sectional view of a lateral trench being formed in a semiconductor substrate in accordance with the present invention.

Referring to FIG. 1, according to an embodiment of the present invention, deep trenches are patterned and etched in a semiconductor substrate (102) using, for example, reactive ion etching (RIE). These deep trenches will form the alternating n-type and p-type electrodes of a lateral trench photo-detector device. The substrate can also include a pad layer (104) formed of, for example, $SiO_2$, and a SiN layer (106) deposited over the $SiO_2$ for use as a chemical-mechanical-polishing (CMP) stop. One skilled in the art would recognize in light of the present invention that other substrates can be used without departing from the scope and spirit of the present invention, for example, silicon germanium, germanium, and single-crystal silicon.

Figure 2:
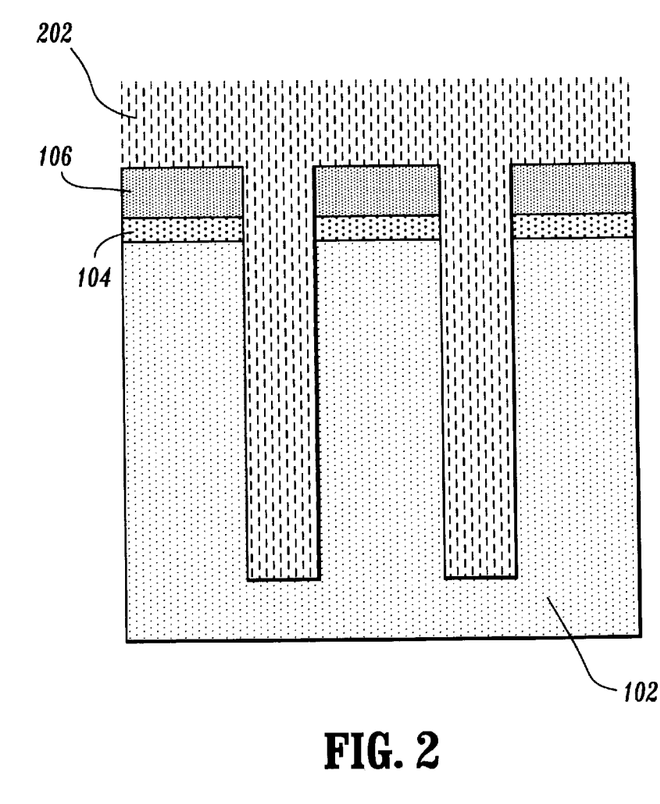
FIG. 2 is cross-sectional view of a lateral trench being formed in a semiconductor substrate in accordance with the present invention, wherein a plurality of trenches are filled with a sacrificial material.

Referring to FIG. 2, the trenches are filled with a sacrificial material (202), such as an oxide (borosilicate glass (BSG), phosphosilicate glass (PSG), Arsensilicate glass (ASG), borophosphosilicate glass (BPSG), tetraorthosilicate (TEOS), etc.). Preferably, the oxide has high etch selectivity to the substrate (102). The sacrificial material may be polished (e.g., CMP) to the underlying SiN layer.

Figure 3:
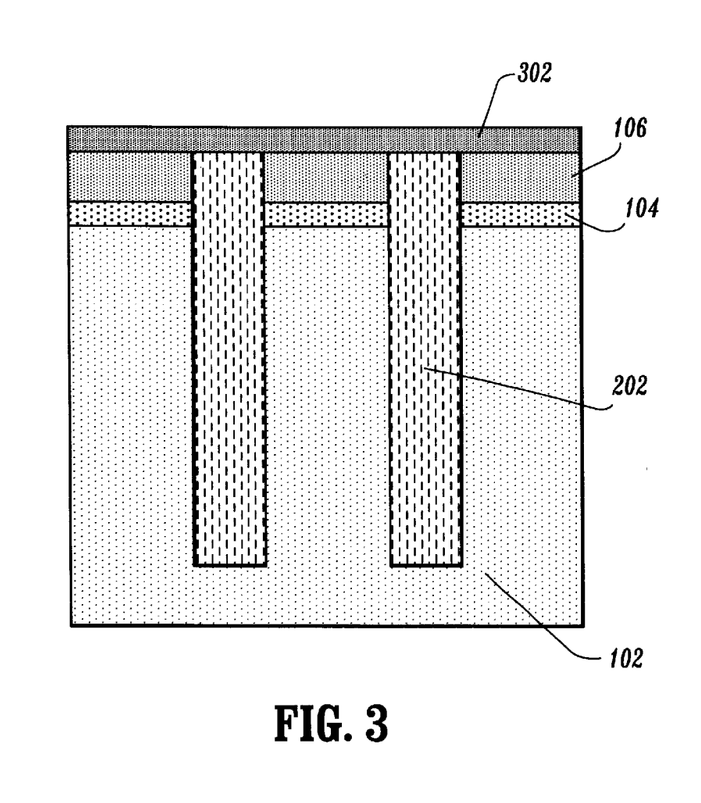
FIG. 3 is cross-sectional view of a lateral trench being formed in a semiconductor substrate in accordance with the present invention, wherein the exposed sacrificial material is polished.
Figure 4:
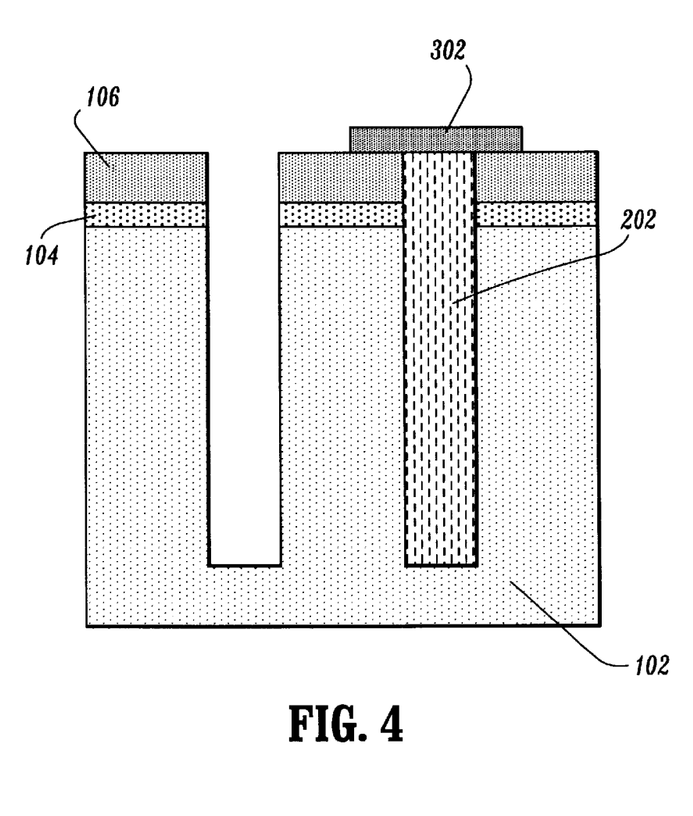
FIG. 4 is cross-sectional view of a lateral trench being formed in a semiconductor substrate in accordance with the present invention, wherein the sacrificial material is removed from a first set of trenches.

Referring to FIG. 3, alternating trenches are masked using, for example, an amorphous Si (302). The mask material (302) is deposited over the surface of the device, the mask material (302) over the alternating trenches is removed to exposed the underlying sacrificial material (202). The sacrificial material (202) is etched out of a first set of trenches (FIG. 4).

Figure 5:
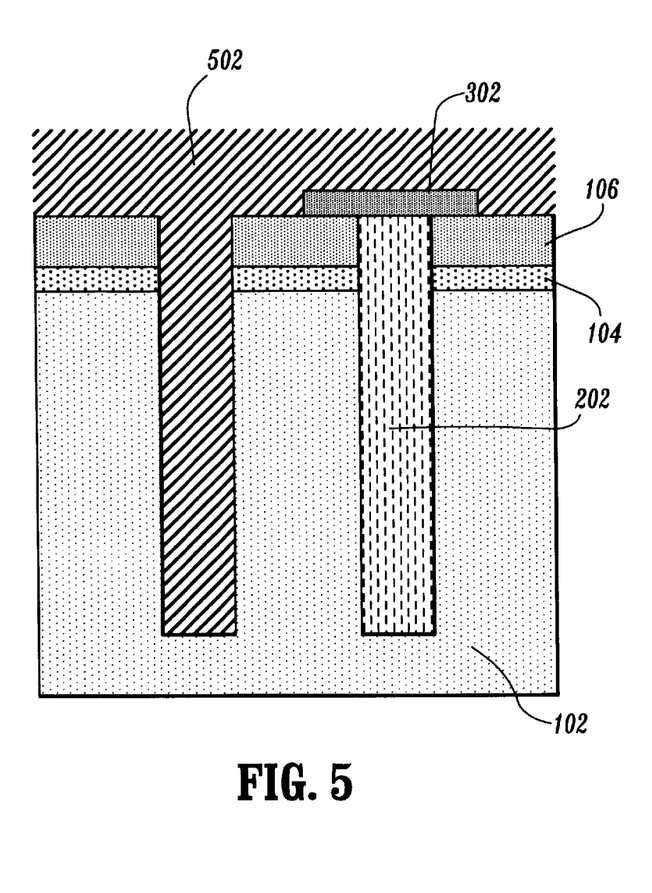
FIG. 5 is cross-sectional view of a lateral trench being formed in a semiconductor substrate in accordance with the present invention, wherein a n+ poly is deposited over the surface of the device.
Figure 6:
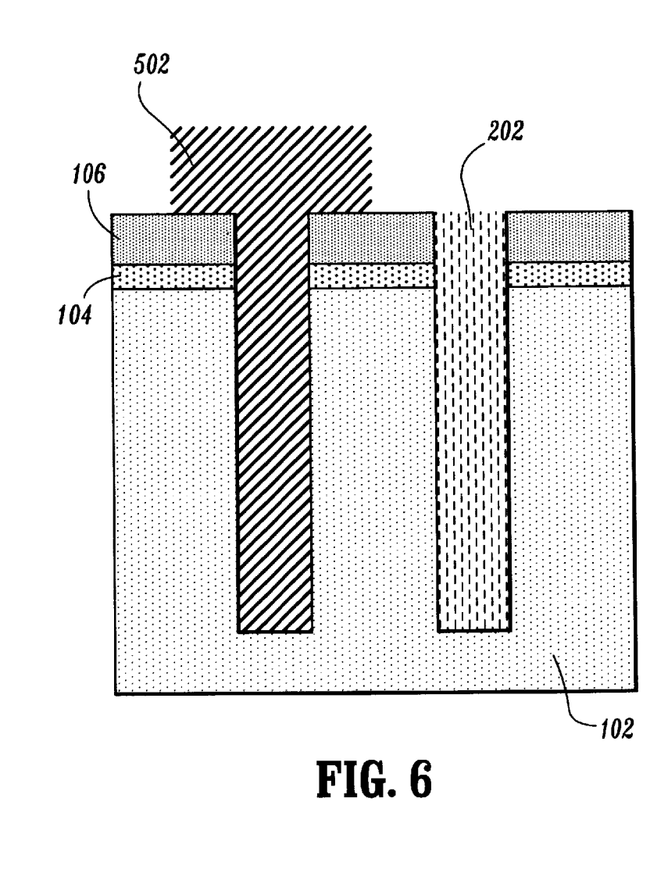
FIG. 6 is cross-sectional view of a lateral trench being formed in a semiconductor substrate in accordance with the present invention, wherein the n+ poly is patterned.
Figure 7:
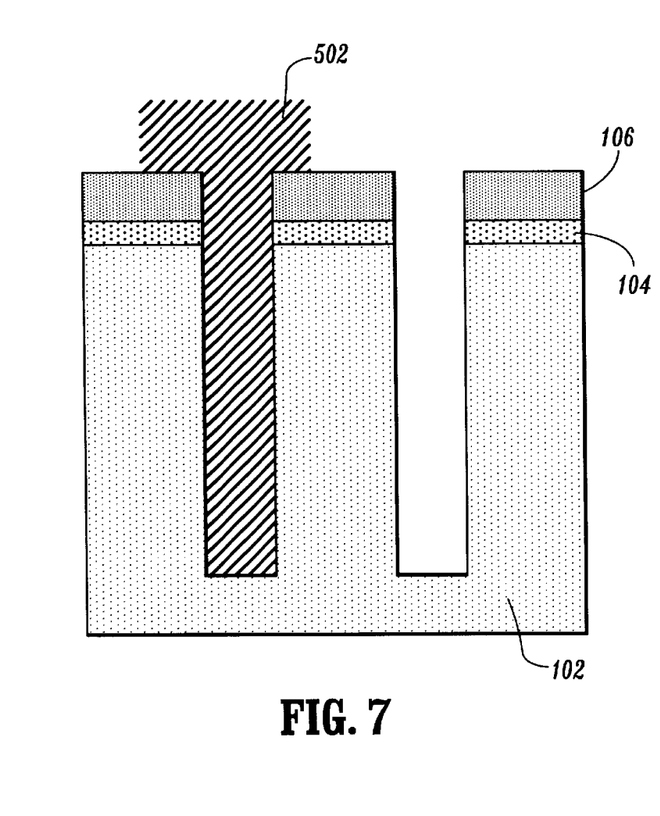
FIG. 7 is cross-sectional view of a lateral trench being formed in a semiconductor substrate in accordance with the present invention, wherein the sacrificial material is removed from a second (first) set of trenches.
Figure 8:
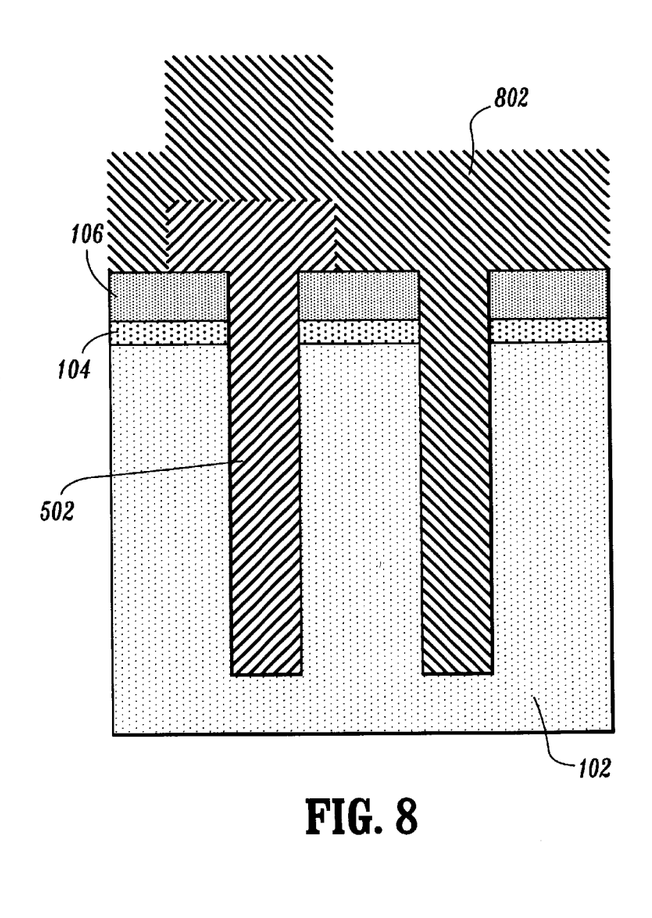
FIG. 8 is cross-sectional view of a lateral trench being formed in a semiconductor substrate in accordance with the present invention, wherein a p-type poly is deposited over the entire surface of the device.

Referring to FIG. 5, the device is covered with a first doped electrode material (502), filling the open trenches. Doped material such as n-type or p-type doped polysilicon can be used. The sacrificial material (202) that was previously masked continues to plug a second set of trenches and keeps the first electrode material (502) from filling the second set of trenches. The electrode material (302) (poly) over the second set of trenches with sacrificial material fillings is patterned and etched. Alternatively, the method can include mechanically polishing and planarizing the device to remove the electrode material that overhangs outside of the trenches. According to the present invention, either means will cause the sacrificial material filling in the second set of trenches to be exposed to the surface of the device. (FIG. 6) The method can include masking the first set of trenches prior to removing the sacrificial material from the second set of trenches. The sacrificial material can be removed by an etch process such as wet etching. (FIG. 7) Referring to FIG. 8, the second set of trenches are filled with a second type of electrode material (802) such as n-type or p-type doped polysilicon. Any excess electrode material outside of trenches can be removed by planarization.

Figure 9:
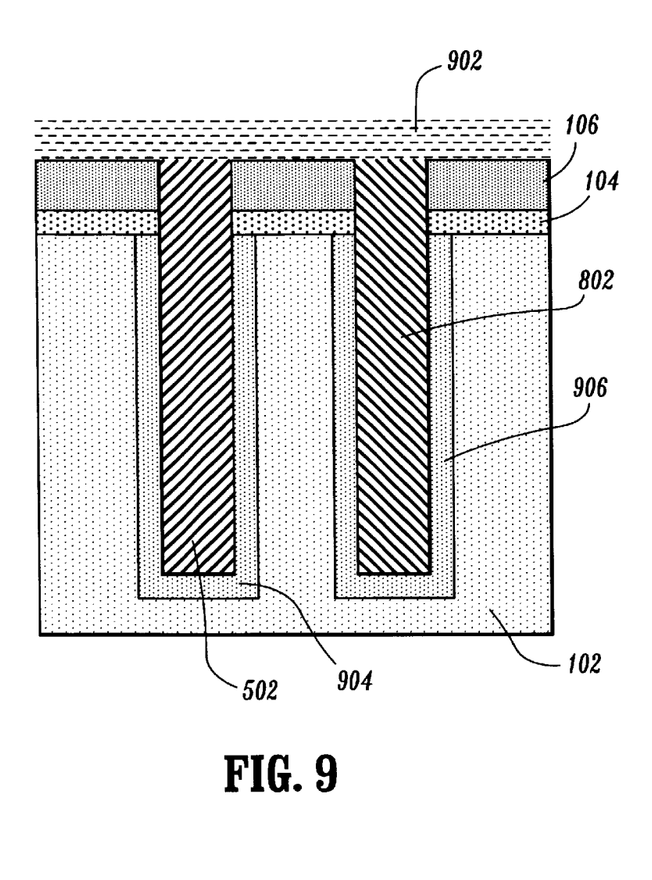
FIG. 9 is cross-sectional view of a lateral trench being formed in a semiconductor substrate in accordance with the present invention, wherein n and p junction layers have been formed.
Figure 10:
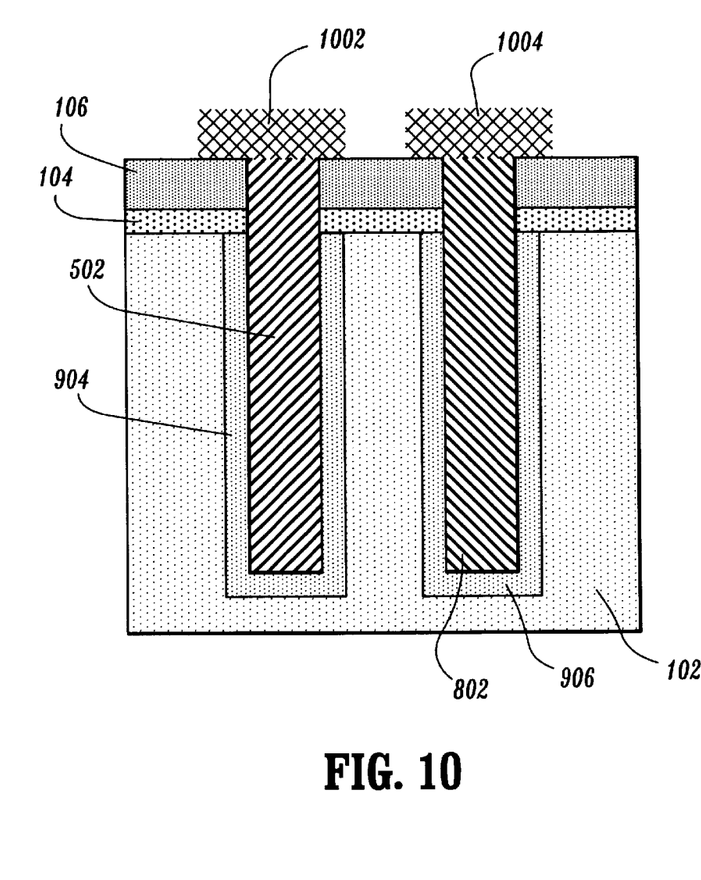
FIG. 10 is cross-sectional view of a lateral trench being formed in a semiconductor substrate in accordance with the present invention, wherein metal contacts are patterned over the doped regions.

Referring to FIG. 9, after planarization, a TEOS diffusion barrier layer (902) is deposited over the device and the dopants are driven into the substrate surrounding the n-type and p-type doped trenches forming the n-type junction (904) and p-type junction (906), respectively. After annealing, the TEOS diffusion barrier layer (902) is removed and metal contacts (1002, 1004) are applied to the electrodes. (FIG. 10).

Figure 11:
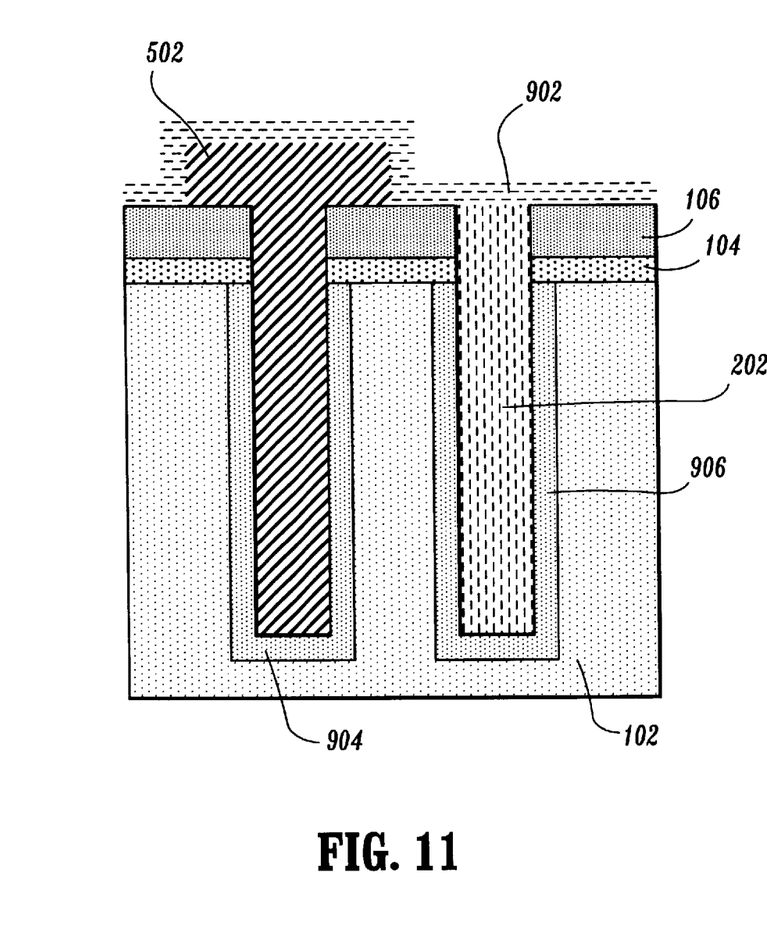
FIG. 11 is cross-sectional view of a lateral trench being formed in a semiconductor substrate in accordance with the present invention, wherein a TEOS diffusion barrier layer is deposited over the device.
Figure 12:
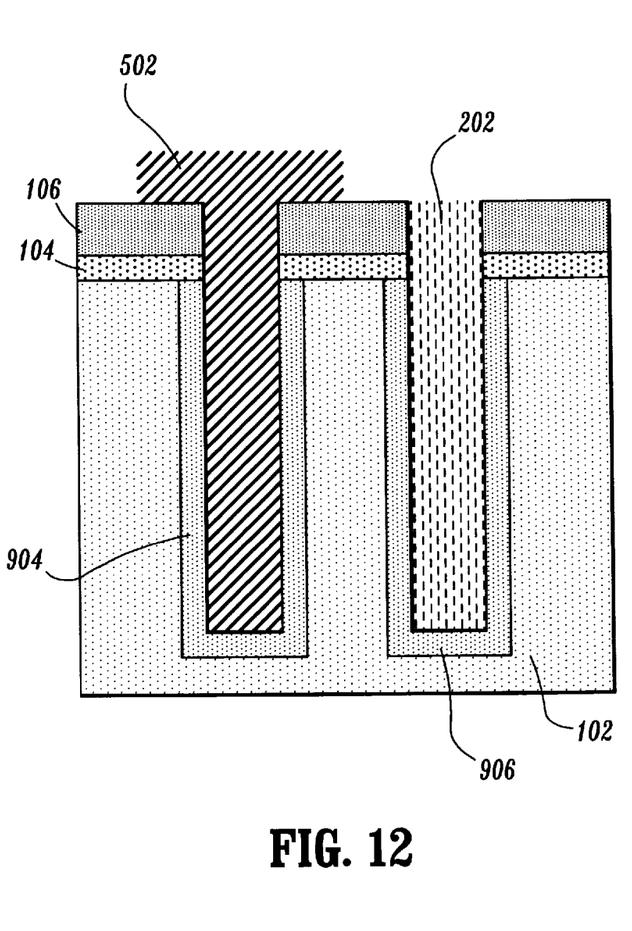
FIG. 12 is cross-sectional view of a lateral trench being formed in a semiconductor substrate in accordance with the present invention, wherein a TEOS diffusion barrier layer has been removed after drive-in anneal from the first doped electrode material (n+ poly) and the sacrificial material.
Figure 13:
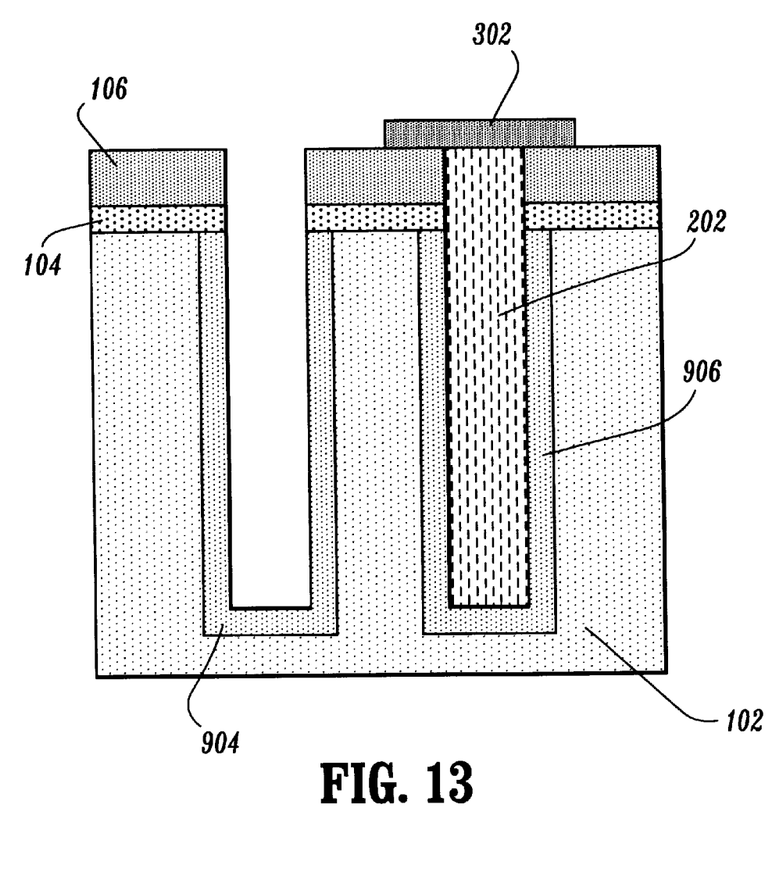
FIG. 13 is cross-sectional view of a lateral trench being formed in a semiconductor substrate in accordance with the present invention, wherein the dopants are driven into the second set of trenches by using Gas Phase Doping and into the first set of trenches from the sacrificial material.

Referring to FIG. 11, according to an embodiment of the present invention, after filling a first set of trenches with an n-type polysilicon (502) and patterning, a TEOS diffusion barrier layer (902) can be deposited over the surface of the device. By using the sacrificial material (202) (e.g., BSG) in a second set of trenches as a p-type dopant source, and a drive-in anneal, an n-type junction (904) and a p-type junction (906) can be formed by out-diffusion from the n-type doped material (502) and the sacrificial material (202), respectively. The TEOS diffusion barrier layer can then be removed. (FIG. 12) Referring to FIG. 13, according to an embodiment of the present invention, after etching a sacrificial material from a first set of alternating trenches, dopants are driven into the first set of trenches by using Gas Phase Doping forming a first junction type (904). Dopants are driven into a second set of trenches from the sacrificial material (202) forming a second junction type (906). The first set of trenches are filled with a first electrode material, excess electrode material covering the second set of trenches is removed. The sacrificial material (302) covering the second set of trenches is etched and the second set of trenches is filled with a second doped electrode material. The first doped electrode material of the first set of trenches is exposed to the surface of the device and wiring connections (contacts, etc.) are provided.

A lateral trench photo-detector has been fabricated according to the present invention on a p-type silicon substrate with a resistivity of 11 to 16 Ω-cm, wherein trenches were 8 µm deep and 0.35 µm wide, and further having a spacing of 3.3 µm between trenches. The device was a circle with a diameter of 75µm. Borosilicate glass (BSG) was used as the sacrificial material, while a first set of trenches was filled with phosphorous-doped polysilicon ($\sim 10^{20}$ cm$^{-3}$) and a second set of trenches was filled with boron-doped polysilicon ($\sim 10^{18}$ cm$^{-3}$). The device was annealed at 1000° C. in Argon for ten minutes to drive the dopant into the substrate and avoid forming junctions at the silicon/polysilicon interface. Silicide and metal contacts were formed on top of each trench electrode.

Some results have shown that the DC I-V characteristics for the lateral trench photo- detector include currents of 1.5 pA and 3 pA at −5V and −15V respectively. The breakdown voltage was approximately −27V. The series resistance of the lateral trench photo-diode extracted from the forward biased 1-V curve is 15 Ω. The responsivity is 045 A/W at 845 nm, independent of the bias voltage. The external quantum efficiency was observed to be sixty-six percent. For a device in accordance with the present invention, responsivity is constant over a frequency range from DC to a −3 dB bandwidth of 2.8 GHZ for a light source at 670 nm.

By wiring the discrete photo detector with a 2.5 Gb/s BiCMOS preamplifier, at a bit-error- rate of $10^{-9}$, the receiver shows a sensitivity of −16.1 dBm at 2.5 Gb/s and −15.4 dBm at 3 Gb/s for a bias of 3.3V. With an increase of the bias to −5.0V, the sensitivity can be improved to −16.4 dBm at 2.5 Gb/s.

Having described embodiments of a method for forming a lateral trench photo-detector, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by letters patent is set forth in the appended claims.

What is claimed is:

1. A method of forming an optical detector device on a semiconductor substrate, comprising the steps of:

forming a first set and a second set of trenches in the substrate, wherein trenches of the first set are alternately disposed with respect to trenches of the second set;

filling the trenches with a sacrificial material;

etching the sacrificial material from the first set of trenches;

filling the first set of trenches with a doped material of a first conductivity;

etching the sacrificial material from a second set of trenches;

filling the second set of trenches with a doped material of a second conductivity;

forming a first junction layer by driving dopants from the doped material in each of the first set of trenches and forming a second junction layer by driving dopants from the doped material in each of the second set of trenches; and providing separate wiring connections to the first set of trenches and the second set of trenches.

2. The method of claim 1, wherein the first set and the second set of trenches in the substrate are formed simultaneously.

3. The method of claim 1, wherein the step of etching the sacrificial material from the first set of trenches further comprises the steps of:

removing sacrificial material from a surface of the device; and masking the second set of trenches.

4. The method of claim 1, wherein the step of providing separate wiring connections further comprises the steps of:

exposing the doped material filling the first set of trenches and the doped material filling the second set of trenches to a surface of the device; and providing each of the first set of trenches with a first set of contacts and the second set of trenches with a second set of contacts.

5. The method of claim 1, wherein the step of forming the junction layers further comprises the steps of:

depositing a diffusion barrier layer over a surface of the device prior to forming the junction layers; and removing the diffusion barrier layer from a surface of the device after forming the junction layers.

6. The method of claim 1, wherein the material of the first conductivity comprises n-type doped polysilicon and the material of the second conductivity comprises p-type doped polysilicon.

7. The method of claim 1, wherein the material of the first conductivity comprises p-type doped polysilicon and the material of the second conductivity comprises n-type doped polysilicon.

8. The method of claim 1, wherein the substrate includes a semiconductor material, a $SiO_2$ layer deposited over the semiconductor material, and a SiN layer deposited over the a $SiO_2$ layer.

9. The method of claim 1, wherein the step of etching the sacrificial material from a second set of trenches further comprises the step of exposing the sacrificial material of the second set of trenches to a surface of the device.

10. The method of claim 9, wherein the step of exposing the sacrificial material of the second set of trenches further comprises the step of removing the doped material of the first conductivity from a region above the second set of trenches by mechanical polish.

11. The method of claim 9, wherein the step of exposing the sacrificial material of the second set of trenches further comprises the steps of:
   patterning the doped material of the first conductivity; and
   etching the doped material of the first conductivity in a region above the second set of trenches.

12. A method of forming an optical detector device on a semiconductor substrate, comprising the steps of:
   forming a first set and a second set of trenches in the substrate, wherein trenches of the first set are alternately disposed with respect to trenches of the second set;
   filling the trenches with a sacrificial material of a first conductivity;
   etching the sacrificial material from the first set of trenches;
   filling the first set of trenches with a doped material of a second conductivity;
   forming a first junction layer by driving dopants from the doped material in each of the first set of trenches and forming a second junction layer by driving dopants from the sacrificial material in each of the second set of trenches;
   etching the sacrificial material from the second set of trenches;
   filling the second set of trenches with an electrode material; and
   providing separate wiring connections to the first set of trenches and the second set of trenches.

13. The method of claim 12, wherein the step of etching the sacrificial material from the first set of trenches further comprises the steps of:
   removing sacrificial material from a surface of the device; and
   masking the second set of trenches.

14. The method of claim 12, wherein prior to forming the junction layers, the doped material of the second conductivity is removed from a surface of the device.

15. The method of claim 12, wherein the step of forming junction layers further comprises the steps of:
   depositing a diffusion barrier layer over the surface of the device prior to forming the junction layers; and
   removing the diffusion barrier layer from a surface of the device after forming the junction layers.

16. The method of claim 12, wherein the step of providing separate wiring connections further comprises the step of exposing the doped material filling the first set of trenches and the electrode material filling the second set of trenches to a surface of the device.

17. The method of claim 12, wherein the electrode material is one of doped material of the first conductivity and undoped material.

18. A method of forming an optical detector device on a semiconductor substrate, comprising the steps of:
   forming a first set and a second set of trenches in the substrate, wherein trenches of the first set are alternately disposed with respect to trenches of the second set;
   filling the trenches with a sacrificial material;
   etching the sacrificial material from the first set of trenches;
   forming a junction layer in the wall of each of the first set of trenches by gas phase doping;
   forming a second junction layer in each wall of each of the second set of trenches; wherein dopants are driven from the sacrificial material into the walls;
   filling the first set of trenches with a doped material of a first conductivity;
   etching the sacrificial material from the second set of trenches;
   filling the second set of trenches with a doped material of a second conductivity; and
   providing separate wiring connections to the first set of trenches and the second set of trenches.

19. The method of claim 18, wherein the step of etching the sacrificial material from the first set of trenches further comprises the steps of:
   removing the sacrificial material from a surface of the device; and
   masking the second set of trenches.

20. The method of claim 18, wherein the step of etching the sacrificial material from the second set of trenches further comprises the step of removing doped material of the first conductivity from a surface of the device.

21. The method of claim 18, wherein the step of providing separate wiring connections further comprises the step of exposing the doped material filling the first set of trenches and the doped material filling the second set of trenches to a surface of the device.

* * * * *